(12) United States Patent  (10) Patent No.: US 8,466,715 B2
Kuang et al.  (45) Date of Patent: Jun. 18, 2013

(54) COMPARATOR

(75) Inventors: Yu Kuang, Hsinchu (TW); Shih-Tzung Chou, Zhudong Township, Hsinchu County (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 13/354,854

(22) Filed: Jan. 20, 2012

(65) Prior Publication Data

US 2012/0200358 A1  Aug. 9, 2012

(30) Foreign Application Priority Data

Feb. 8, 2011  (TW) .............................. 100104143 A

(51) Int. Cl.
*H03K 5/22* (2006.01)
(52) U.S. Cl.
USPC .................................. 327/66; 327/64; 327/65
(58) Field of Classification Search
USPC ............................... 327/63–67; 330/257, 258
See application file for complete search history.

(56) References Cited

U.S. PATENT DOCUMENTS 7,605,657 B2 * 10/2009 Schelmbauer ................ 330/258
7,843,231 B2 * 11/2010 Arguello .......................... 327/63

* cited by examiner

*Primary Examiner* — Long Nguyen

(57) ABSTRACT

A comparator includes: a wide-swing operation transconductance amplifier (OTA), having first and second differential input pairs for receiving first and second differential input signals respectively, the wide-swing OTA generating first and second intermediate output voltages in comparing the first with the second differential input signals; a current switch group; a current mirror group, wherein when an input common mode voltage of the first and the second differential input signal tends to one of a first and a second reference voltage, one of the first and the second differential input pair is turned off, and the current switch group and the current mirror group compensate a current flowing through the other of the first and the second differential input pair; and a decision circuit coupled to the wide-swing OTA, for enlarging a voltage difference between the first and the second intermediate output voltage to output a voltage comparison output signal.

10 Claims, 18 Drawing Sheets

COMPARATOR

This application claims the benefit of Taiwan application Serial No. 100104143, filed Feb. 8, 2011, the subject matter of which is incorporated herein by reference.

TECHNICAL FIELD

The disclosure relates in general to a comparator with dual differential input pairs, and more particularly to a comparator with a rail-to-rail input voltage range.

BACKGROUND

A comparator (also referred as 'a voltage comparator') is an integrated circuit. The voltage comparator compares the magnitudes of two input voltages to determine which is higher. Which input voltage is higher is determined and indicated by an output voltage from the comparator.

As for the conventional comparators, when the conventional comparator compares the differential input voltages, the range of the input common mode voltage identified by the comparator is not rail-to-rail. That is, the range of the input common mode voltage identified by the comparator is not from the ground voltage GND to the operation voltage VDD. If the input common mode voltage tends to the ground voltage GND, the comparator with PMOS transistor differential input pair is used. To the contrary, if the input common mode voltage tends to the operation voltage VDD, the comparator with NMOS transistor differential input pair is used.

BRIEF SUMMARY OF THE DISCLOSURE

The disclosure is directed to a comparator with dual differential input pairs. When the input common mode voltage tends to a ground voltage GND, the NMOS transistor differential input pair is turned off and a current flowing through the PMOS transistor differential input pair is compensated. When the input common mode voltage tends to an operation voltage VDD, the PMOS transistor differential input pair is turned off and a current flowing through the NMOS transistor differential input pair is compensated. Thus, the operation range of the input common mode voltage may be from the ground voltage GND to the operation voltage VDD, that is, rail-to-rail input.

According to an exemplary embodiment of the disclosure, a comparator including a wide-swing operation transconductance amplifier (OTA), a current switch group, a current mirror group, and a decision circuit is provided. The wide-swing OTA at least includes a first and a second differential input pair for receiving a first and a second differential input signal respectively, and generates a first and a second intermediate output voltage in comparing the first and the second differential input signal. When an input common mode voltage of the first and the second differential input signal tends to one of a first and a second reference voltage, one of the first and the second differential input pair is turned off, and the current switch group and the current mirror group compensate a current flowing through the other of the first and the second differential input pair. The decision circuit enlarges a voltage difference between the first and the second intermediate output voltage to output a voltage comparison output signal.

It is to be understood that both the foregoing general description and the following detailed description are exemplary and explanatory only and are not restrictive of the disclosed embodiments, as claimed.

DETAILED DESCRIPTION OF THE DISCLOSURE

Figure 1A:
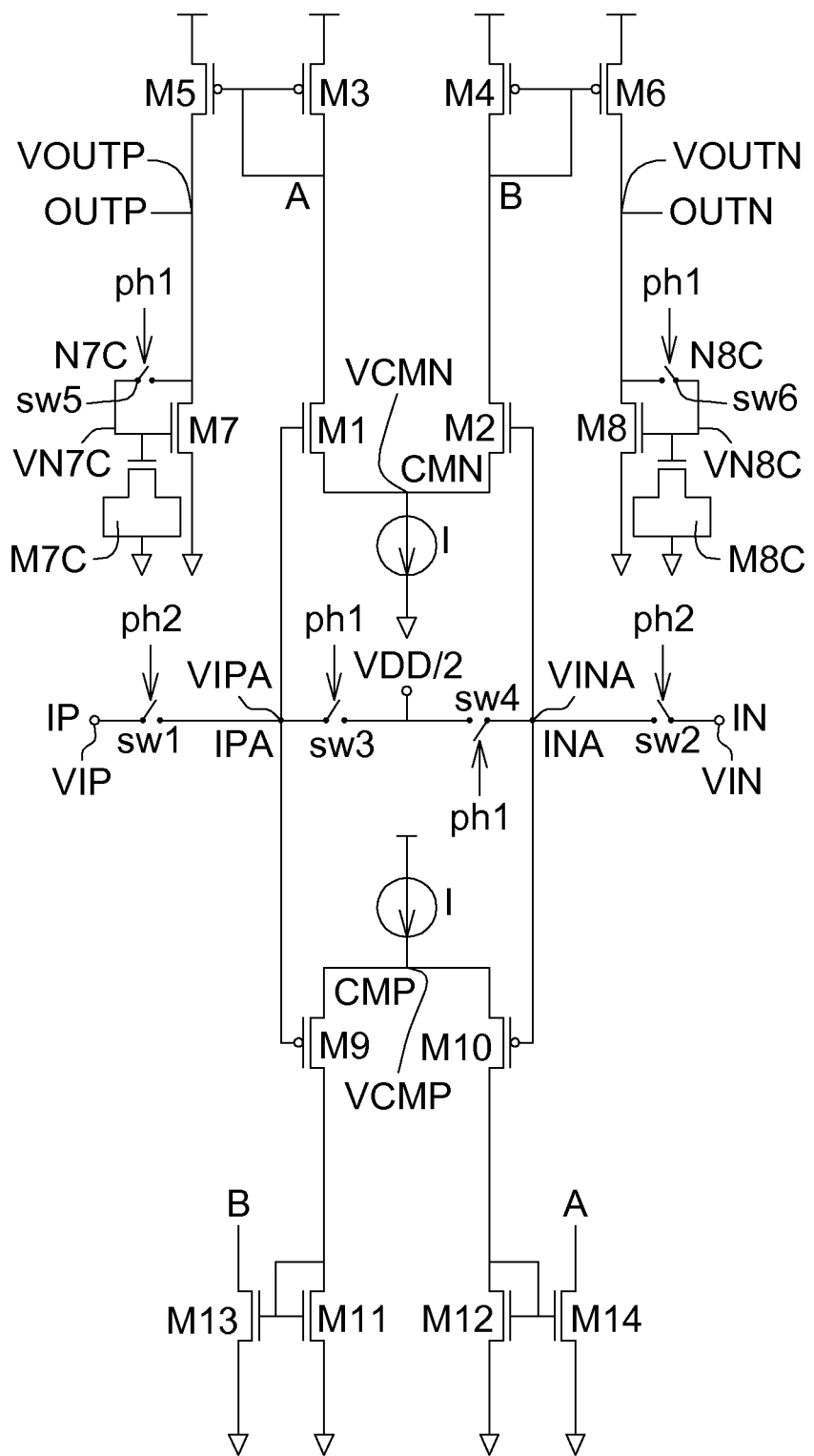
FIG. 1A, FIG. 1B and FIG. 2 are circuit diagrams of a rail-to-rail comparator according to an embodiment of the disclosure.
Figure 1B:
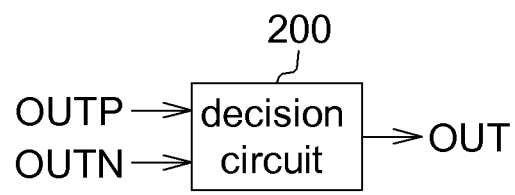
Figure 1B:
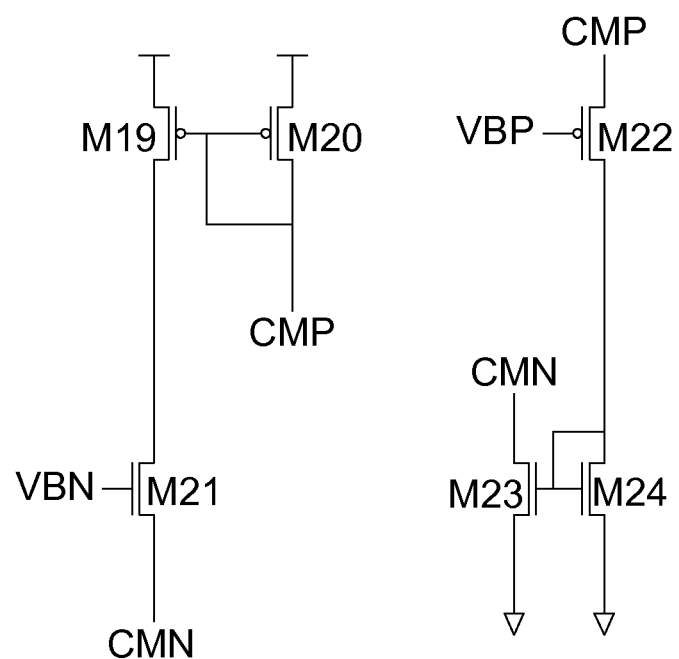
Figure 2:
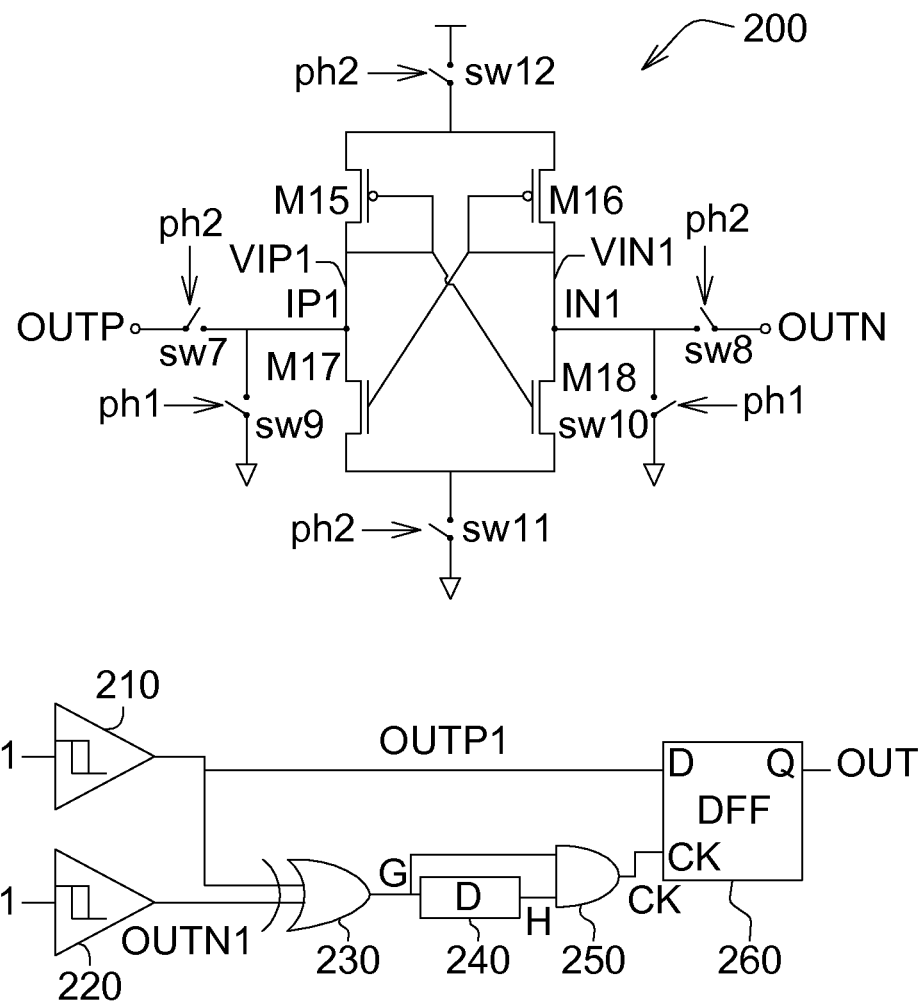

FIG. 1A, FIG. 1B and FIG. 2 are circuit diagrams of a rail-to-rail comparator according to an embodiment of the disclosure. As indicated in FIG. 1A and FIG. 1B, the rail-to-rail comparator includes a wide-swing operation transconductance amplifier (OTA), an input switch group sw1~sw4, NMOS capacitors M7C and M8C, current switches M21 and M22, a first current mirror M19 and M20, a second current mirror M23 and M24, and a decision circuit 200. The rail-to-rail comparator receives a first control pulse signal ph1 and a second control pulse signal ph2.

The wide-swing OTA includes transistors M1~M14 and switches sw5~sw6. The transistors M1 and M2 form an NMOS transistor differential input pair. The transistors M3 and M5 form a current mirror. The transistors M4 and M6 form a current mirror.

The transistors M9 and M10 form a PMOS transistor differential input pair. The transistors M11 and M13 form a current mirror. The transistors M12 and M14 form a current mirror.

The transistors M19 and M20 form a current mirror. The transistor M21 is connected to the NMOS transistor differential input pair M1 and M2 in parallel; and the transistor M21 and the current mirror M19 and M20 together compensate a current flowing through the NMOS transistor differential input pair M1 and M2.

The transistor M22 is connected to the PMOS transistor differential input pair M9 and M10 in parallel; and the transistor M22 and the current mirror M23 and M24 together compensate a current flowing through the PMOS transistor differential input pair M9 and M10. The transistors M23 and M24 form a current mirror.

Conduction of the switches sw1 and sw2 determine whether voltages VIP and VIN are coupled to nodes IPA and INA respectively. Conduction of the switches sw3 and sw4 determine whether a voltage VDD/2 is coupled to the nodes IPA and INA respectively. The switch sw5 determines whether the gate and the drain of the transistor M7 are coupled to each other. The switch sw6 determines whether the gate and the drain of the transistor M8 are coupled to each other.

Referring to FIG. 2. The decision circuit 200 includes: transistors M15~M18, switches sw7~sw12, Schmitt triggers 210 and 220, a logic gate circuit 230 (such as but not limited to an XOR logic gate), a delay circuit 240, a logic circuit 250 (such as but not limited to an AND logic gate) and a D-type flip-flop 260.

The transistors M15~M18 form a positive feedback loop. The transistors M15 and M18 are for raising the voltage VIP1 up to VDD or for lowering the voltage VIN1 to the ground voltage GND. The transistors M16 and M17 are for raising the voltage VIN1 up to VDD or for lowering the voltage VIP1 to the ground voltage GND.

Conduction of the switches sw7 and sw8 determine whether output voltages VOUTP and VOUTN are coupled to the nodes IP1 and IN1 respectively. Conduction of the switches sw9 and sw10 determine whether the nodes IP1 and IN1 respectively are coupled to the ground voltage GND. Conduction of the switches sw11 and sw12 respectively determines whether the operation voltage VDD and the ground voltage GND are connected to the transistors M15~M18.

The Schmitt triggers 210 and 220 receive signals IP1 and IN1 respectively, and output signals OUTP1 and OUTN1 respectively. The XOR logic gate 230 receives signals OUTP1 and OUTN1 and outputs a signals G. The delay circuit 240 delays the signal G by a delay time Td into a signal H. The AND logic gate 250 receives signals G and H and outputs a signal CK. The D-type flip-flop 260 determines whether to latch the signal OUTP1 according to the signal CK.

Figure 3:
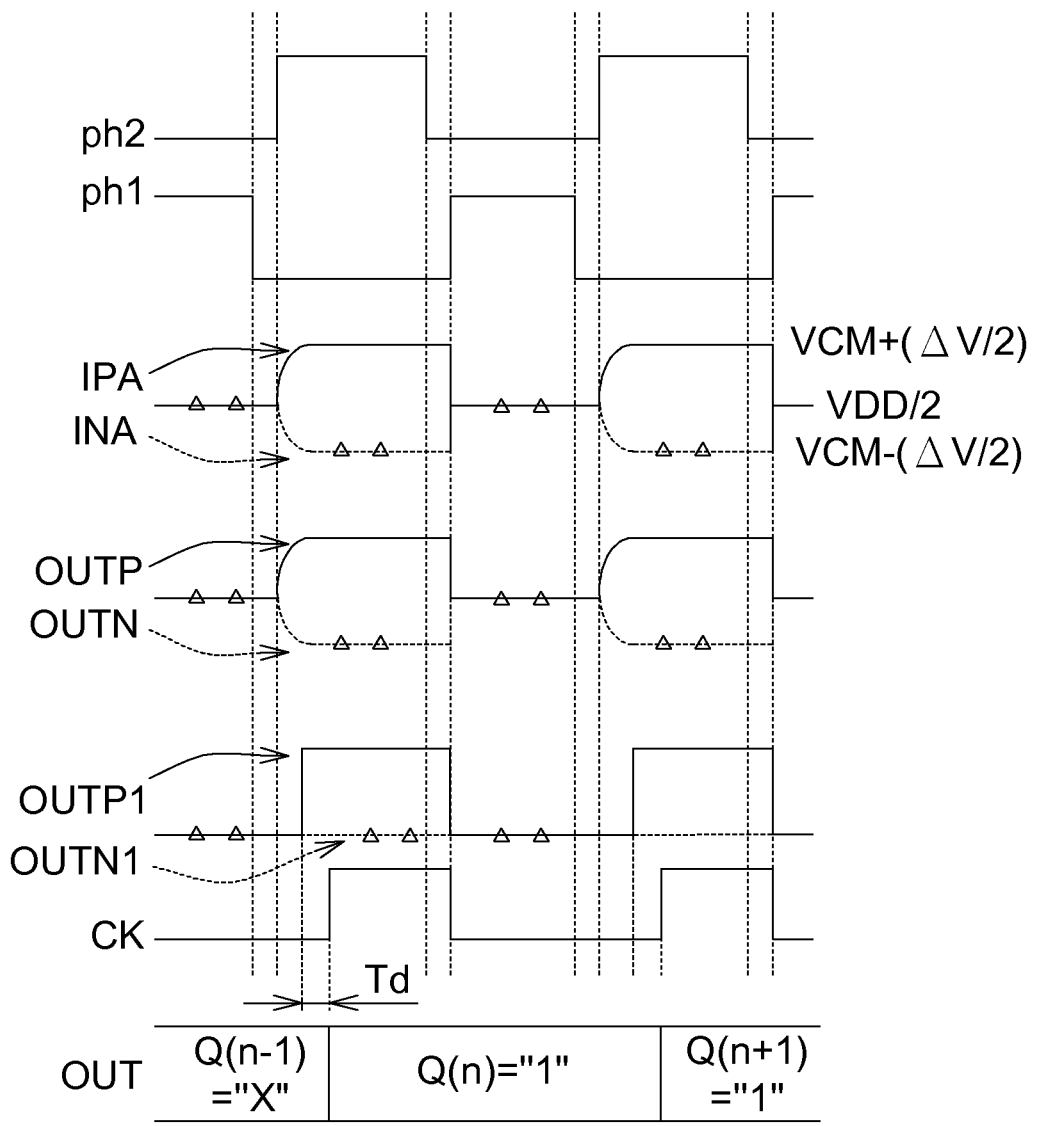
FIG. 3 shows a signal timing diagram of the embodiment of the disclosure.

FIG. 3 shows a signal timing diagram of the comparator of the embodiment of the disclosure. The control pulse signals ph1 and ph2 are inverse to each other, and there is no overlapping between the high logic levels of the two signals. For better understanding, the waveforms of the signals INA, OUTN, OUTN1 are marked by triangles (Δ) to be discriminated from the waveforms of the signals IPA, OUTP, OUTP1 (no marks).

Figure 4:
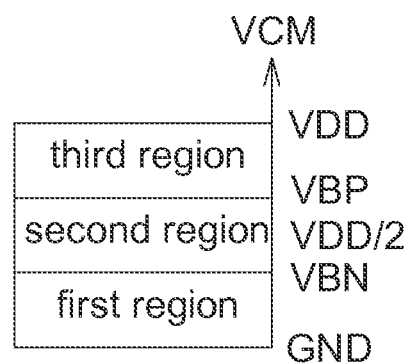
FIG. 4 shows a range of an input common mode voltage VCM of an OTA of the embodiment of the disclosure.

FIG. 4 shows a range of an input common mode voltage VCM of the OTA. The voltage VCM is defined as: VCM=(VIPA+VINA)/2=(VIP+VIN)/2.

Within a first region, the input common mode voltage VCM of the OTA is smaller than VBN (VCM<VBN), wherein VBN is a bias voltage applied to the NMOS transistor M21. When the input common mode voltage VCM of the OTA is smaller than VBN, the average voltage of the gate voltages VIPA and VINA of the NMOS transistor differential input pair M1 and M2 is low so that the node voltage VCMN is also low, making the gate-source voltage of the current switch M21 (i.e. VBN−VCMN) exceed its conduction threshold voltage so that the current switch M21 is turned on, and the current mirror M19 and M20 is also turned on. In addition, the average voltage of the gate voltage VIPA and VINA of the PMOS transistor differential input pair M9 and M10 is low so that the node voltage VCMP is also low, making the source-gate voltage of the current switch M22 (i.e. VCMP−VBP) is lower than its conduction threshold voltage, the current switch M22 is turned off, and the current mirror M23 and M24 is also turned off.

Within a second region, the input common mode voltage VCM of the OTA ranges between VBN and VBP (VBN<VCM<VBP), wherein VBP is a bias voltage applied to the PMOS transistors M22. When the input common mode voltage VCM of the OTA ranges between VBN and VBP, the average voltage of the gate voltages VIPA and VINA of the NMOS transistor differential input pair M1 and M2 is moderate. Since the node voltage VCMN is not low enough to make the gate-source voltage of the current switch M21 (that is, VBN−VCMN) exceed its conduction threshold voltage, the current switch M21 is turned off. Since the node voltage VCMP is not high enough to make the source-gate voltage of the current switch M22 (that is, VCMP−VBP) exceed its conduction threshold voltage, the current switch M22 is turned off. Within the second region, the current mirror M19 and M20 as well as the current mirror M23 and M24 are turned off.

Within a third region, the input common mode voltage VCM of the OTA is larger than bias voltage VBP. As the average voltage of the gate voltages VIPA and VINA of the PMOS transistor differential input pair M9 and M10 is high, the node voltage VCMP is also high, making the source-gate voltage of the current switch M22 (that is, VCMP−VBP) exceed the conduction threshold voltage of the current switch M22 so that the current switch M22 is turned on, and the current mirror M23 and M24 is also turned on. As the average voltage of the gate voltages VIPA and VINA of the NMOS transistor differential input pair M1 and M2 is high, the node voltage VCMN is also high, making the gate-source voltage of the current switch M21 (that is, VBN−VCMN) does not exceed the conduction threshold voltage of the current switch M21, so the current switch M21 is turned off and the current mirror M19 and M20 is also turned off.

The operations of the comparator according to the embodiment of the disclosure are disclosed below, which include two steps. In the first step, the first control pulse signal ph1 is at high logic level, the second control pulse signal ph2 is at low logic level, and the comparator is equalized. In the second step, the first control pulse signal ph1 is at low logic level and the second control pulse signal ph2 is at high logic level so that the comparator performs a voltage comparison and outputs a comparison result.

First Step: Equalization

Figure 5A:
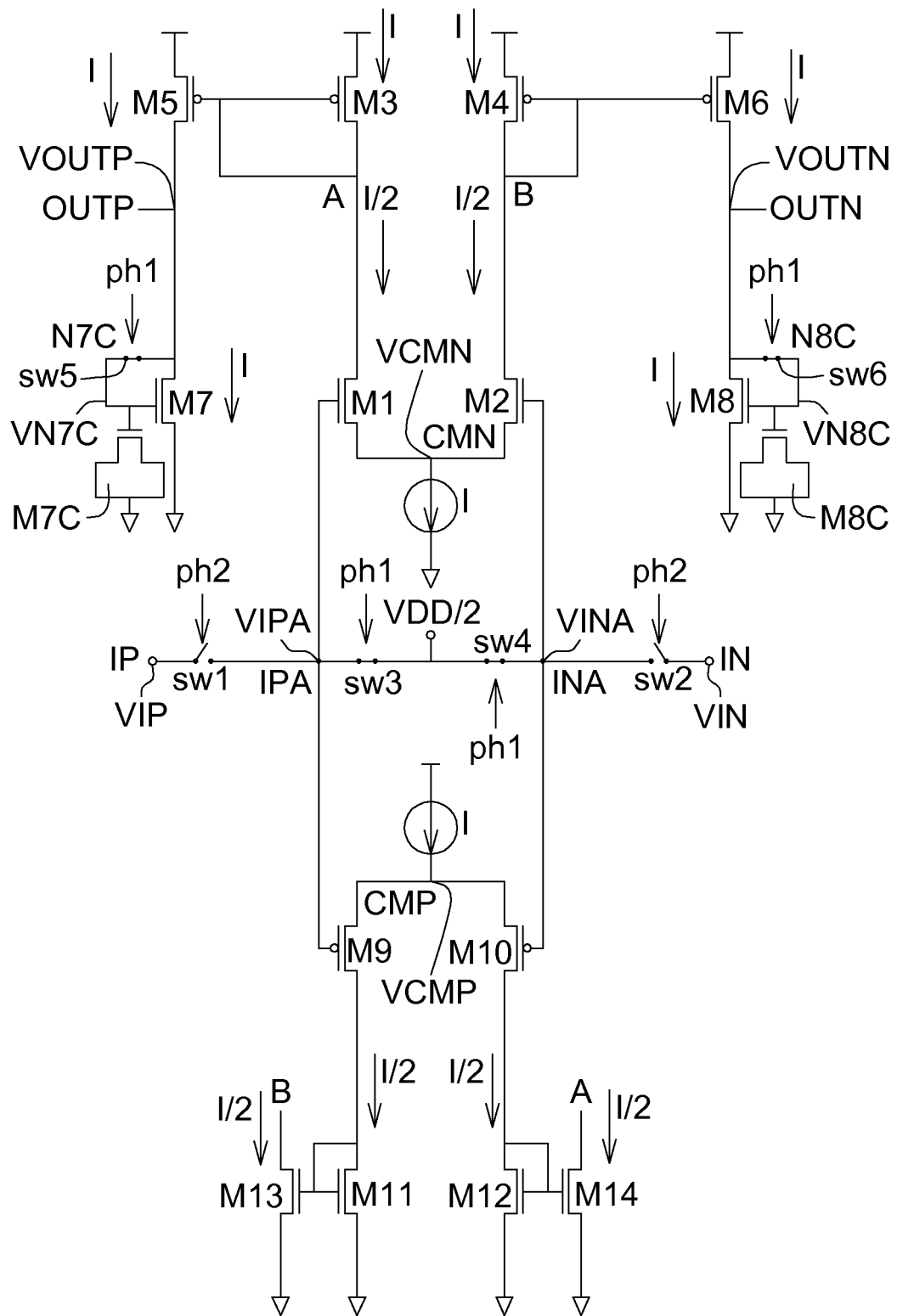
FIG. 5A to FIG. 12B are circuit operation diagrams of the comparator according to the embodiment of the disclosure.
Figure 5B:
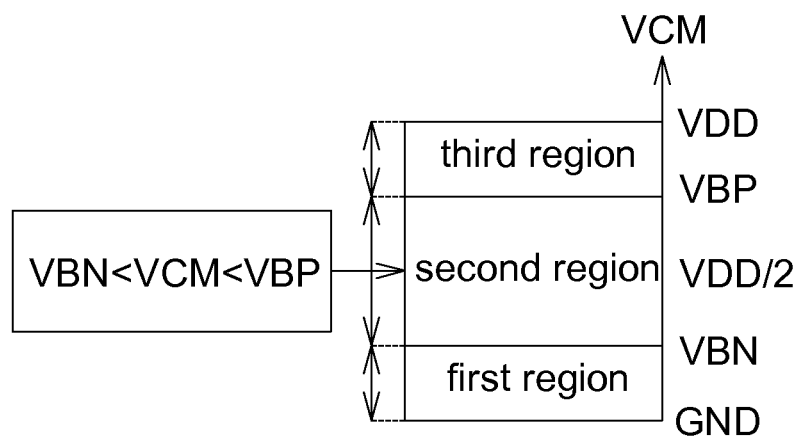
Figure 5B:
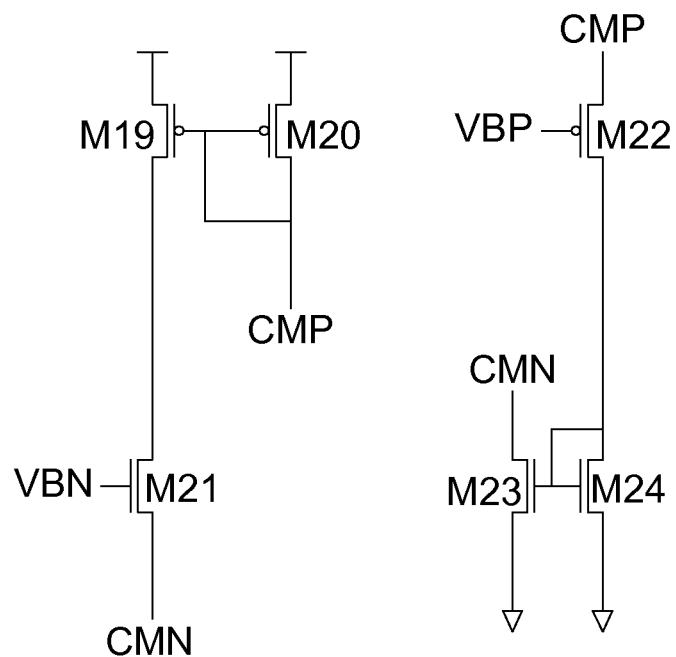
Figure 6:
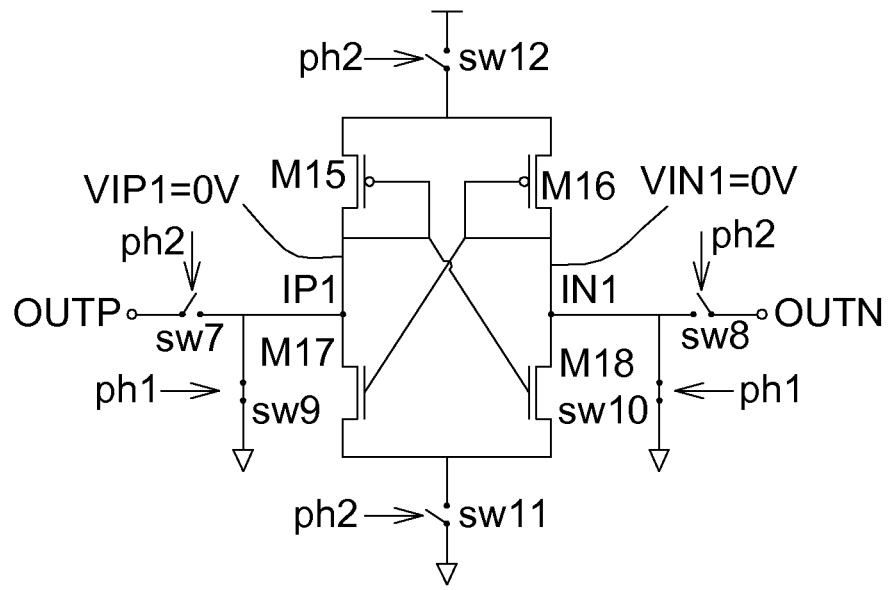
Figure 6:
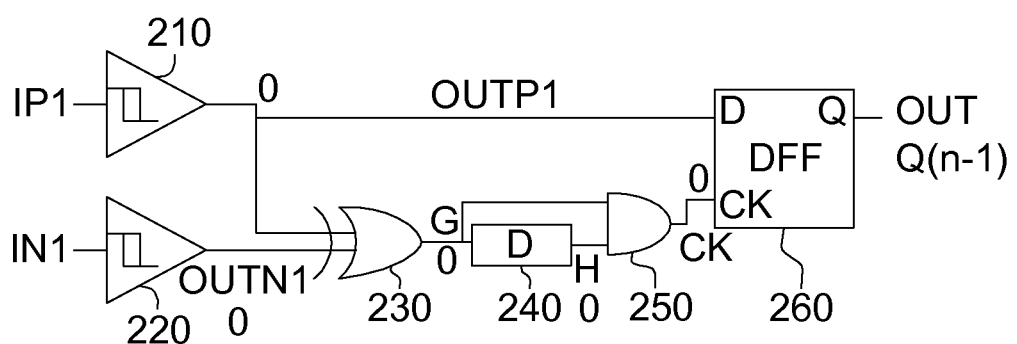

Referring to FIG. 5A, FIG. 5B and FIG. 6, circuit operation diagrams of the comparator in the first step are shown. As indicated in FIG. 5A and FIG. 5B, since the first control pulse signal ph1 is at high logic level and the second control pulse signal ph2 is at low logic level, the switches sw3 and sw4 of the input switch group are turned on; the switch sw1 and sw2 are disconnected, and the switches sw5 and sw6 of the OTA are turned on. So, the comparator input voltages IPA and INA are both equal to VDD/2, and the input common mode voltage VCM of the OTA ranges between VBN and VBP (VBN<VCM<VBP). That is, the input common mode voltage VCM is within the second region of FIG. 4. Thus, the current switches M21 and M22, the current mirror M19 and M20, and the current mirror M23 and M24 are all turned off. In the first step, the gate bias voltages VN7C and VN8C of the transistors M7 and M8 are established and stored in the NMOS capacitors M7C and M8C respectively. The steady current of the OTA is indicated in FIG. 5A and FIG. 5B. In the first step, the currents flowing through the NMOS transistor differential input pair M1 and M2, the PMOS transistor differential input pair M9 and M10, the current mirror M11 and M13, and the current mirror M12 and M14 are all equal to I/2. The currents flowing through the current mirrors M3 and M5, M4 and M6, and M7 and M8 are all equal to I.

Referring to FIG. 6. In the first step, in the decision circuit 200, the switches sw9 and sw10 are turned on, and the switches sw7, sw8, sw11 and sw12 are disconnected, so the node voltages VIP1 and VIN1 of the nodes IP1 and IN1 are all equal to GND (0V). Thus, the outputs OUTP1 and OUTN1 of the Schmitt trigger 210 and 220 are both at low logic level, the output G of the XOR logic gate 230 is at low logic level, and the output CK of the AND logic gate 250 is at low logic level. Since the input pulse signal CK of the D flip-flop 260 is at low logic level, the D flip-flop 260 outputs a previous output data Q(n−1).

Second Step:

In the second step, the input switches sw3 and sw4 are disconnected, the switches sw1 and sw2 are turned on, and the switches sw5 and sw6 of the OTA are disconnected. Meanwhile, the inputs IPA and INA are respectively connected to the differential inputs IP and IN. Based on the magnitude of the voltage of the input common mode voltage VCM of the OTA, the second step is further divided into 5 scenarios, namely, VBN<VCM<VBP, VDD≧VCM>VBP, VCM=VBP, VCM=VBN and GND≦VCM<VBN. The operations of the comparator under the 5 scenarios are disclosed below.

Scenario 1 of the Second Step: VBN<VCM<VBP

If the voltage VIP of the differential input IP of the comparator is VCM+(ΔV/2), the voltage VIN of the differential input IN is VCM−(ΔV/2), and VBN<VCM<VBP, then the input common mode voltage of the OTA falls within the second region of FIG. 4. As disclosed above, within the second region, the current switches M21 and M22, the current mirror M19 and M20, and the current mirror M23 and M24 are all turned off.

Figure 7A:
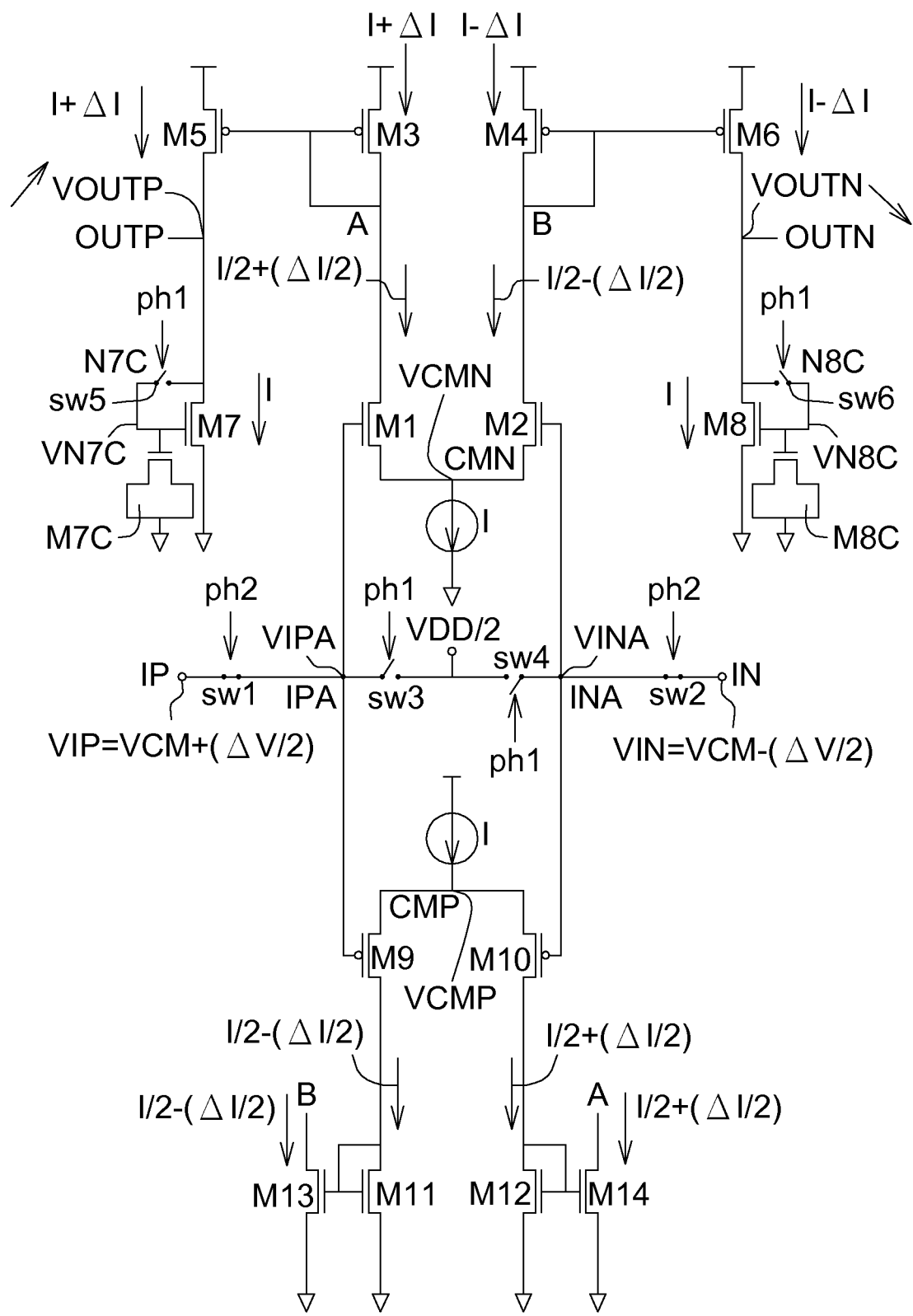
Figure 7B:
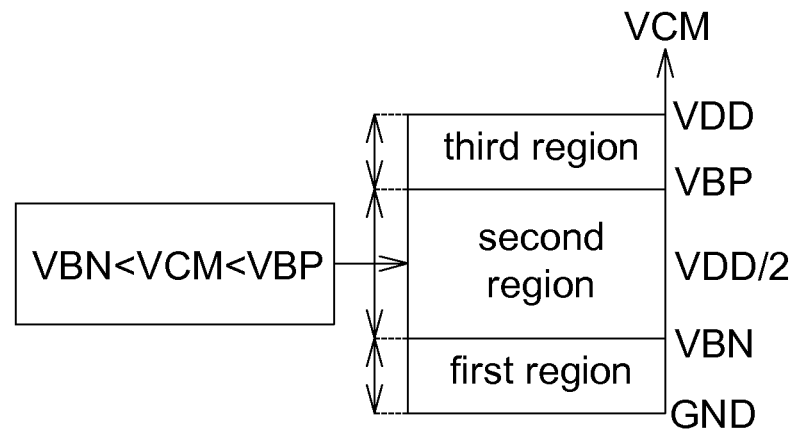
Figure 7B:
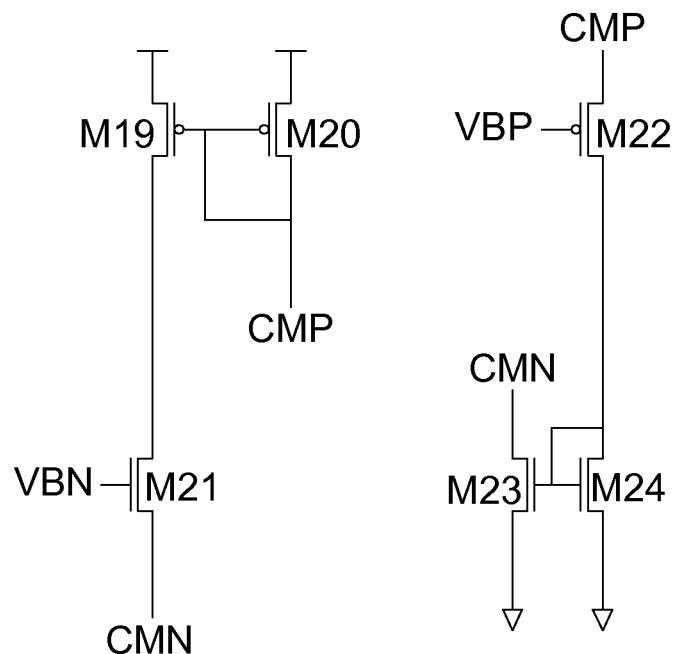
Figure 8:
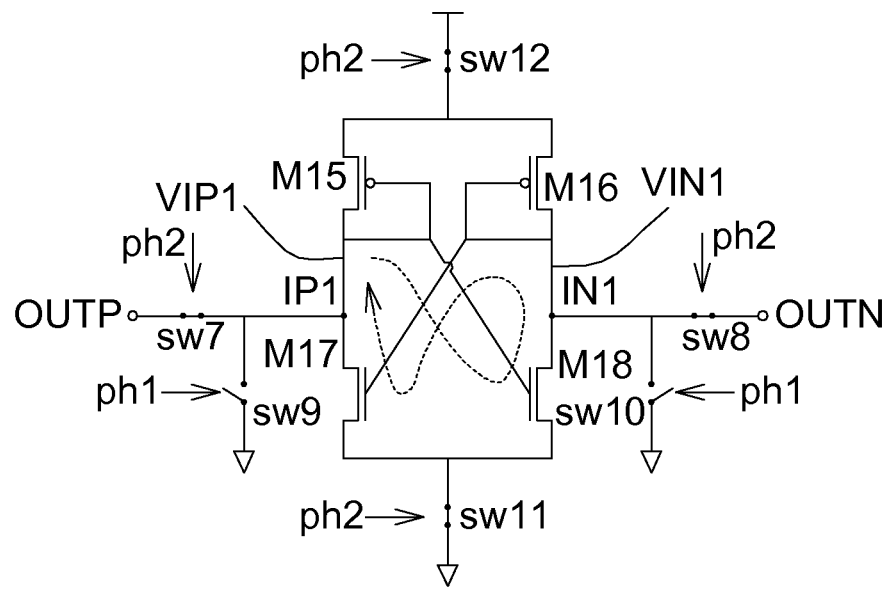
Figure 8:
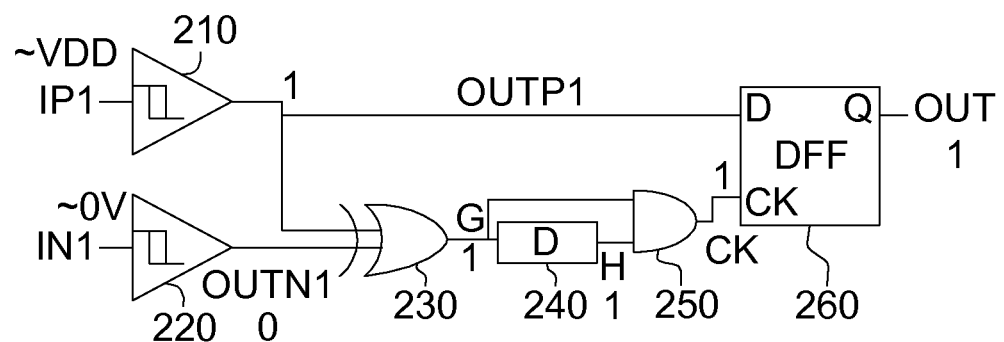

FIG. 7A, FIG. 7B and FIG. 8 are circuit operation diagrams of the comparator in the second step and VBN<VCM<VBP. Referring to FIG. 7A and FIG. 7B. In the present scenario, the currents flowing through the PMOS transistor differential input pair M9 and M10 are I/2−(ΔI/2) and I/2+(ΔI/2) respectively, and the current flowing into the NMOS transistor differential input pair M1 and M2 are I/2+(ΔI/2) and I/2−(ΔI/2) respectively. The current flowing to the transistor M11 is I/2−(ΔI/2), and the current flowing to the transistor M12 is I/2+(ΔI/2). The transistors M11 and M13 form a current mirror, so the currents flowing through the two transistors are the same. Likewise, the transistors M12 and M14 form a current mirror, so the currents flowing through the two transistors are the same. The total current flowing through the transistor M3 is the sum of the two currents flowing through the transistors M1 and M14; and the total current flowing through the transistor M4 is the sum of the two currents flowing through the transistors M2 and M13. Thus, the total currents flowing through the transistors M3 and M4 are I+ΔI and I−ΔI respectively. Since the transistors M3 and M5 form a current mirror, the current flowing through the transistors M5 is I+ΔI. Since the transistors M4 and M6 form a current mirror, the current flowing through the transistor M6 is I−ΔI.

Since the gate voltages of the transistor M7 and M8 are already stored in the NMOS capacitors M7C and M8C respectively in the first step, the currents flowing through the transistor M7 and M8 are I. The current flowing to the node OUTP from the transistor M5 is I+ΔI, but the current flowing to the transistor M7 from the node OUTP is I, and the current difference ΔI flows to the decision circuit 200 via the node OUTP. Due to parasitic capacitance effect, the current difference ΔI causes the voltage VOUTP of the node OUTP to be raised. Similarly, current flowing to the node OUTN from the transistors M6 is I−ΔI, but the current flowing to the transistor M8 from the node OUTN is I, and the current difference ΔI is provided by the decision circuit 200 (i.e. the decision circuit 200 provides the current difference ΔI to the transistor M8 via the node OUTN). Due to parasitic capacitance effect, the current difference ΔI causes the voltage VOUTN of the node OUTN to be lowered.

Referring to FIG. 8. The switches sw9 and sw10 of the decision circuit 200 are disconnected, the switches sw7 and sw8 are turned on so that the nodes IP1 and IN1 are connected to the node OUTP and OUTN respectively. The switch sw12 is turned on so that the sources of the transistors M15 and M16 are connected to the operation voltage VDD via the switch sw12. The switch sw11 is turned on so that the sources of the transistors M17 and M18 are connected to the ground voltage GND via the switch sw11. As disclosed above, the voltage VOUTP of the node OUTP is raised so that the voltage VIP1 of the nodes IP1 is raised as well; and the voltage VOUTN of the node OUTN is lowered so that the voltage VIN1 of the node IN1 is lowered as well. As the voltage VIP1 is raised, the gate-source voltage of the transistors M18 is higher, increasing the current flowing through the transistors M18 and lowering the voltage VIN1 of the nodes IN1. Similarly, as the voltage VIN1 of the node IN1 is lowered, the gate-source voltage of the transistor M17 is reduced, decreasing the current of the transistor M17 and raising the voltage VIP1 of the node IP1. Thus, the transistors M15~18 form a positive feedback loop (designated by the dotted lines of FIG. 8), making the voltages VIP1 and VIN1 towards different directions. That is, the voltage VIP1 gradually tends to the operation voltage VDD, and the voltage VIN1 gradually tends to the ground voltage GND. The outputs OUTP1 and OUTN1 of the Schmitt trigger 210 and 220 are high logic level and low logic level respectively, so the output G of the XOR logic gate 230 transits to high logic level from low logic level. The delay time of the delay circuit 240 is Td. After the time Td (from the transition of the output G of the XOR logic gate 230), the output CK of the AND logic gate 250 transits to high logic level from low logic level. After the signal CK transits to high logic level, the D-type flip-flop 260 latches the H signal OUTP1, so the output Q(n) of the D-type flip-flop 260 is at high logic level 1. Q(n)=1 indicates that the comparator detects and determines that the input voltage VIP is larger than the input voltage VIN.

Similarly, if the voltage VIP of the differential input IP of the comparator is VCM−(ΔV/2), the voltage VIN of the differential input IN is VCM+(ΔV/2), and VBN<VCM<VBP, then the output Q(n) of the D-type flip-flop 260 is at low logic level 0. Q(n)=0 indicates that the comparator detects and determines that the input voltage VIP is smaller than the input voltage VIN (due to the operations of the decision circuit 200, the voltage VIP1 gradually tends to the ground voltage GND, and the voltage VIN1 gradually tends to the operation voltage VDD).

Scenario 2 of the Second Step: VDD≧VCM>VBP

Figure 9A:
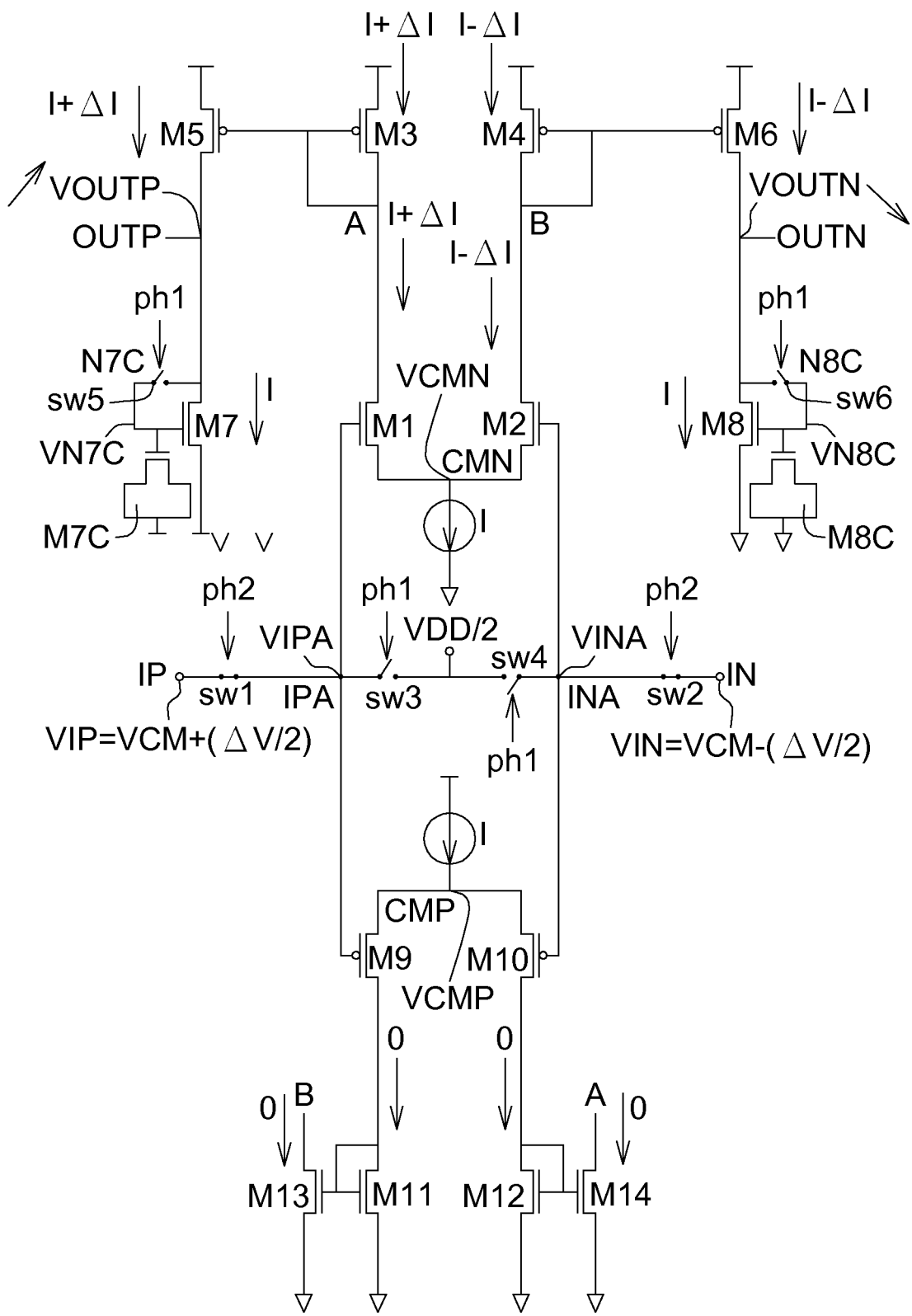
Figure 9B:
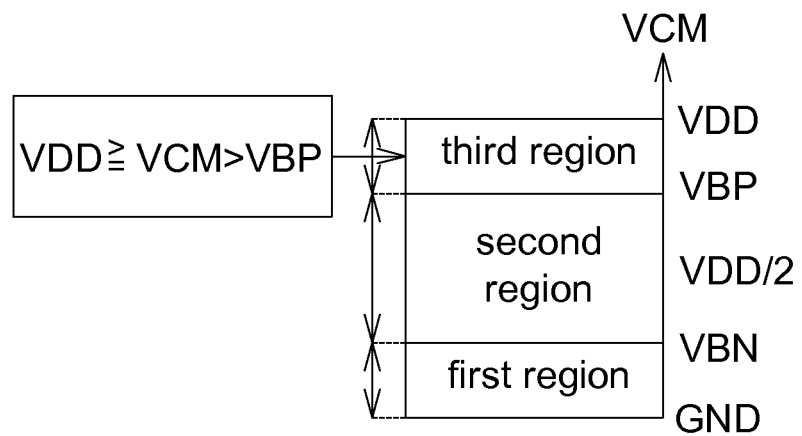
Figure 9B:
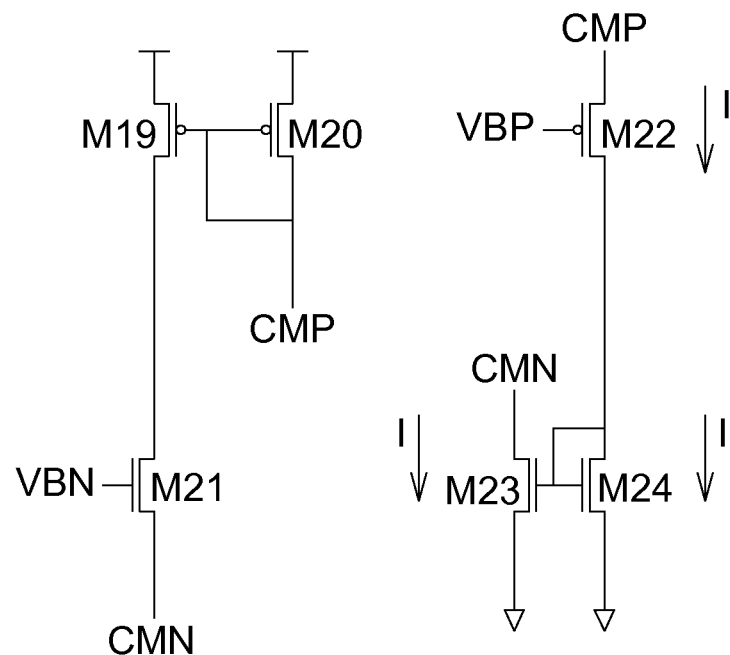

FIG. 9A and FIG. 9B are circuit operation diagrams of the comparator in the second step and VDD≧VCM>VBP. If the voltage VIP of the differential input IP of the comparator is VCM+(ΔV/2), the voltage VIN of the differential input IN is VCM−(ΔV/2), and VCM>VBP, then the input common mode voltage of the OTA falls within the third region. As disclosed above, the current switch M21 and the current mirror M19 and M20 are turned off, but the current switch M22 and the current mirror M23 and M24 are turned on, as indicated in FIG. 9A and FIG. 9B.

In this scenario, as the average voltage of the gate voltages VIPA and VINA of the PMOS transistor differential input pair M9 and M10 is high, the node voltage VCMP is raised accordingly, and the transistors M9~14 are turned off. Since the current I flows into the drain of the transistor M23, the current flowing through the transistor M23 is provided by the NMOS transistor differential input pair M1 and M2. The current flowing through the node CMN changes to 2I from I, wherein a current I flows to the current source I from the node CMN, and a current I flows to the transistor M23 from the node CMM. Given that VDD≧VCM>VBP, the current flowing through the node CMN is doubled (in comparison to the scenario that VBN<VCM<VBP), so the currents flowing to the NMOS transistor differential input pair M1 and M2 are doubled as I+ΔI and I−ΔI from I/2+(ΔI/2) and I/2−(ΔI/2) respectively, and the total currents flowing through the transistors M3 and M4 are I+ΔI and I−ΔI respectively. Due to current mirroring, the currents flowing through the transistors M5 and M6 are I+ΔI and I−ΔI respectively. Since the gate voltages of the transistors M7 and M8 are stored in the NMOS capacitors M7C and M8C respectively in the first step, the currents flowing through the transistor M7 and M8 still remain at I.

The current flowing to the node OUTP from the transistors M5 is I+ΔI, but the current flowing to the transistor M7 from the node OUTP is I. The current difference ΔI flows to the decision circuit 200 via the node OUTP. Due to parasitic capacitance effect, the current difference ΔI causes the voltage VOUTP of the node OUTP to be raised. Similarly, the current flowing to the node OUTN from the transistor M6 is I−ΔI, but the current flowing to the transistor M8 from the node OUTN is I. A current difference ΔI is provided by the decision circuit 200. Due to parasitic capacitance effect, the current difference ΔI causes the voltage VOUTN of the node OUTN to be lowered. In this scenario, the operations of the decision circuit 200 are identical or similar to FIG. 8, and the details are not repeated here. Q(n)=1 indicates that the comparator detects and determines that the input voltage VIP is larger than the input voltage VIN. Q(n)=0 indicates that the comparator detects and determines that the input voltage VIP is smaller than the input voltage VIN.

Scenario 3 of the Second Step: VCM=VBP

Figure 10A:
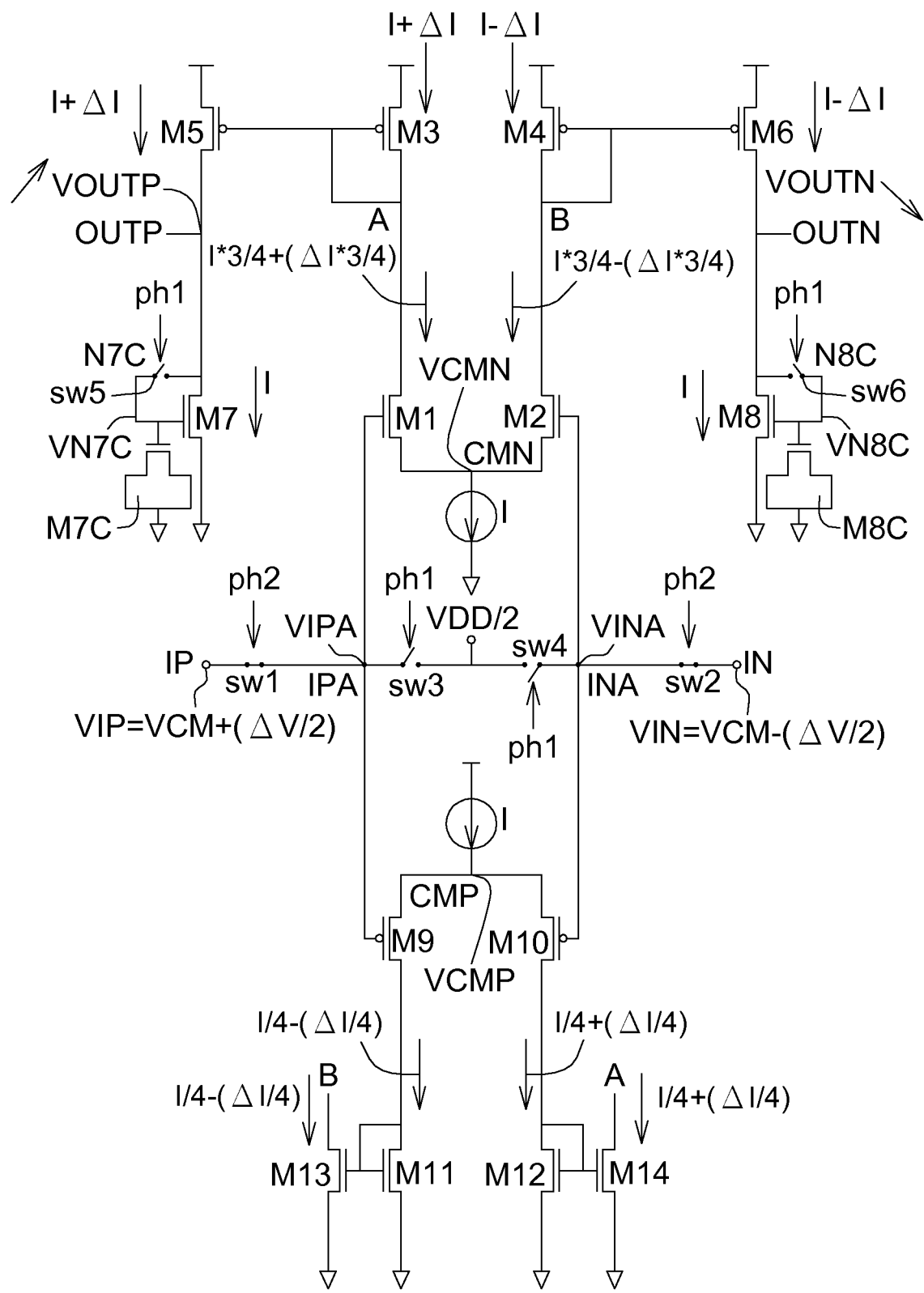
Figure 10B:
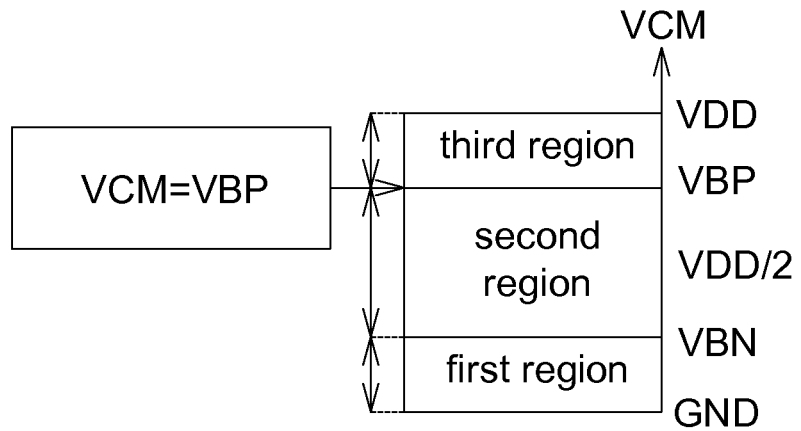
Figure 10B:
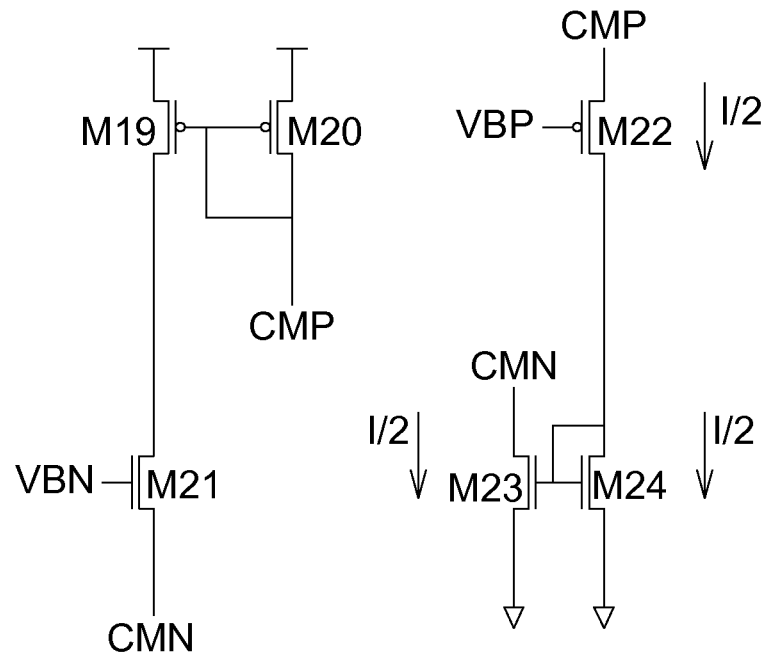

FIG. 10A and FIG. 10B are circuit operation diagrams of the comparator in the second step and VCM=VBP. If the voltage VIP of the differential input IP of the comparator is VCM+(ΔV/2), the voltage VIN of the differential input IN is VCM−(ΔV/2) and VCM=VBP, then the input common mode voltage of the OTA falls on the border between the second region and the third region. The current switch M21 and current mirror M19 and M20 are turned off, but the current switch M22 and the current mirror M23 and M24 are turned on. If the aspect ratio (the ratio of the channel width to the channel length) of the transistor M22 is the same as the sum of the aspect ratios of the transistors M9 and M10, then the current flowing to the transistor M22 is I/2, and the current flowing to the drain of the transistor M23 is also I/2.

Since the transistor M23 drains a current I/2 from the node CMN, the current flowing through the node CMN become 1.5 times (in comparison to the scenario when VBN<VCM<VBP). Thus, the currents flowing to the NMOS transistor differential pair M1 and M2 become 1.5 times (in comparison to the scenario when VBN<VCM<VBP), as I*¾+(ΔI*¾) and I*¾−(ΔI*¾) from I/2+(ΔI/2) and I/2−(ΔI/2) respectively.

Likewise, since the transistor M22 drains a current I/2 from the node CMP, the transistor M22 drains away a half of the current provided to the node CMP by the current source I (that is, I/2 is drained by the transistor M22). Consequently, the currents flowing to the PMOS transistor differential input pair M9 and M10 are halved (in comparison to the scenario when VBN<VCM<VBP), and the currents flowing through the M10 and M9 are halved as to I/4+(ΔI/4) and I/4−(ΔI/4) from I/2+(ΔI/2) and I/2−(ΔI/2) respectively.

The current flowing into the transistor M11 is the same as the current flowing through the transistor M9, i.e. I/4−(ΔI/4). The current flowing to the transistor M12 is the same as the current flowing through the transistor M10, i.e. I/4+(ΔI/4). Due to current mirroring, the currents flowing to the transistors M13 and M14 are I/4−(ΔI/4) and I/4+(ΔI/4) respectively. Thus, the total currents flowing through the transistors M3 and M4 are I+ΔI and I−ΔI respectively. Due to current mirroring, the total currents flowing through the transistors M5 and M6 are I+ΔI and I−ΔI respectively. Since the gate voltages of the transistors M7 and M8 are stored in the NMOS capacitors M7C and M8C respectively in the first step, the currents flowing through the transistor M7 and M8 still remain at I.

The current flowing to the node OUTP from the transistor M5 is I+ΔI, but the current flowing to the transistor M7 from the node OUTP is I. So, a current difference ΔI flows to the decision circuit 200 via the node OUTP. Due to parasitic capacitance effect, the current difference ΔI causes the voltage VOUTP of the node OUTP to be raised. Similarly, the current flowing to the node OUTN from the transistor M6 is I−ΔI, but the current flowing to the transistor M8 from the node OUTN is I. A current difference ΔI is provided by the decision circuit 200. Due to parasitic capacitance effect, the current difference ΔI causes the voltage VOUTN of the node OUTN to be lowered. In this scenario, the operations of the decision circuit 200 are identical or similar to FIG. 8, and the details are not repeated here. Q(n)=1 indicates that the comparator detects and determines that the input voltage VIP is larger than the input voltage VIN. Q(n)=0 indicates that the comparator detects and determines that the input voltage VIP is smaller than the input voltage VIN.

Scenario 4 of the Second Step: VCM=VBN

Figure 11A:
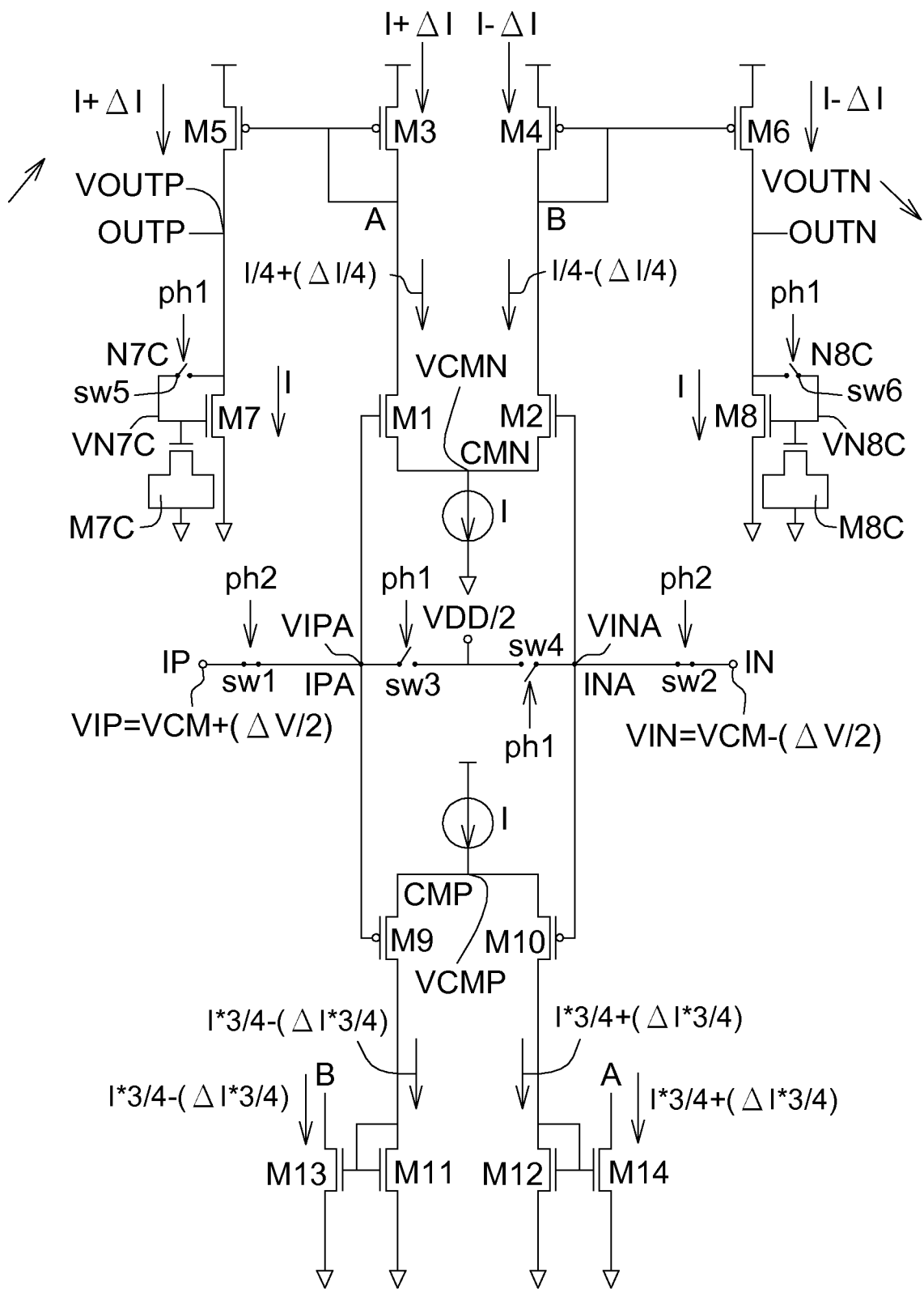
Figure 11B:
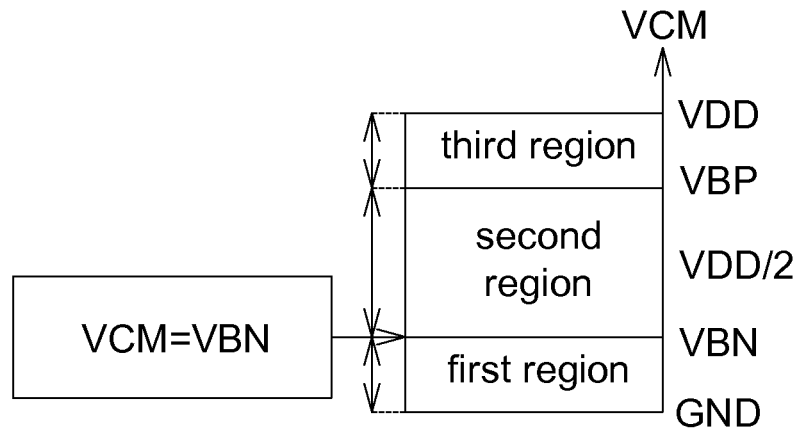
Figure 11B:
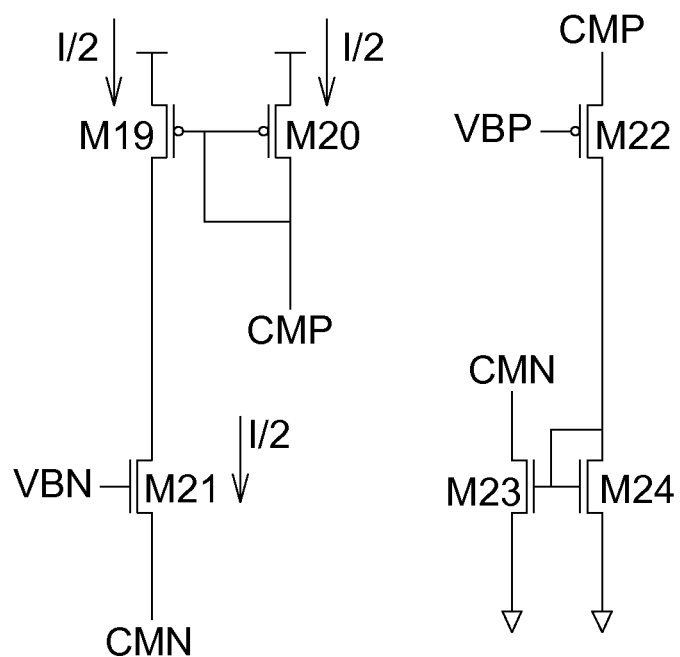

FIG. 11A and FIG. 11B are circuit operation diagrams of the comparator in the second step and VCM=VBN. If the voltage VIP of the differential input IP of the comparator is VCM+(ΔV/2), the voltage VIN of the differential input IN is VCM−(ΔV/2), and VCM=VBN, then the input common mode voltage of the OTA falls on the border between the first region and the second region. The current switch M22 and the current mirror M23 and M24 are turned off, but the current switch M21 and the current mirror M19 and M20 are turned on. If the aspect ratio of the transistor M22 is the same as the sum of the aspect ratios of the transistors M1 and M2, then the current flowing through the transistor M21 is I/2, and the current flowing through the drain of the transistor M20 is also I/2.

Since the transistor M21 provides a current I/2 to the node CMN, the current provided to the node CMN by the NMOS transistor differential input pair M1 and M2 is halved (that is, I/2) in comparison to the scenario VBN<VCM<VBP. Thus, the currents flowing to the NMOS transistor differential pair M1 and M2 is halved (in comparison to the scenario VBN<VCM<VBP) as I/4+(ΔI/4) and I/4−(ΔI/4) from I/2+(ΔI/2) and I/2−(ΔI/2) respectively.

Likewise, since the transistor M20 provides a current I/2 to the node CMP and the current source still provides a current I to the node CMP, the currents flowing to the PMOS transistor differential input pair M9 and M10 become 1.5 times (in comparison to the scenario VBN<VCM<VBP). Thus, the currents flowing through the M10 and M9 become 1.5 times, as I*¾+(ΔI*¾) and I*¾−(ΔI*¾) from I/2+(ΔI/2) and I/2−(ΔI/2) respectively.

The current flowing to the transistor M11 is the same as the current flowing through the transistor M9, i.e. I*¾−(ΔI*¾). The current flowing to the transistor M12 is the same as the current flowing through the transistor M10, i.e. I*¾+(ΔI*¾). Due to current mirroring, the currents flowing to the transistors M13 and M14 are I*¾−(ΔI*¾) and I*¾+(ΔI*¾) respectively. Thus, the total currents flowing through the transistors M3 and M4 are I+ΔI and I−ΔI respectively. Due to current mirroring, the total currents flowing through the transistors M5 and M6 are I+ΔI and I−ΔI respectively. Since the gate voltages of the transistors M7 and M8 are stored in the NMOS capacitors M7C and M8C in the first step respectively, the currents flowing through the transistor M7 and M8 still remain at I.

The current flowing to the node OUTP from the transistor M5 is I+ΔI, but the current flowing to the transistor M7 from the node OUTP is I. The current difference ΔI flows to the decision circuit 200 via the node OUTP. Due to parasitic capacitance effect, the current difference ΔI causes the voltage VOUTP of the node OUTP to be raised. Similarly, the current flowing to the node OUTN from the transistor M6 is I−ΔI, but the current flowing to the transistor M8 from the node OUTN is I. The current difference ΔI is provided by the decision circuit 200. Due to parasitic capacitance effect, the current difference ΔI causes the voltage VOUTN of the node OUTN to be lowered. In this scenario, the operations of the decision circuit 200 are identical or similar to FIG. 8, and the details are not repeated here. Q(n)=1 indicates that the comparator detects and determines that the input voltage VIP is larger than the input voltage VIN. Q(n)=0 indicates that the comparator detects and determines that the input voltage VIP is smaller than the input voltage VIN.

Scenario 5 of the Second Step: GND≦VCM<VBN

Figure 12A:
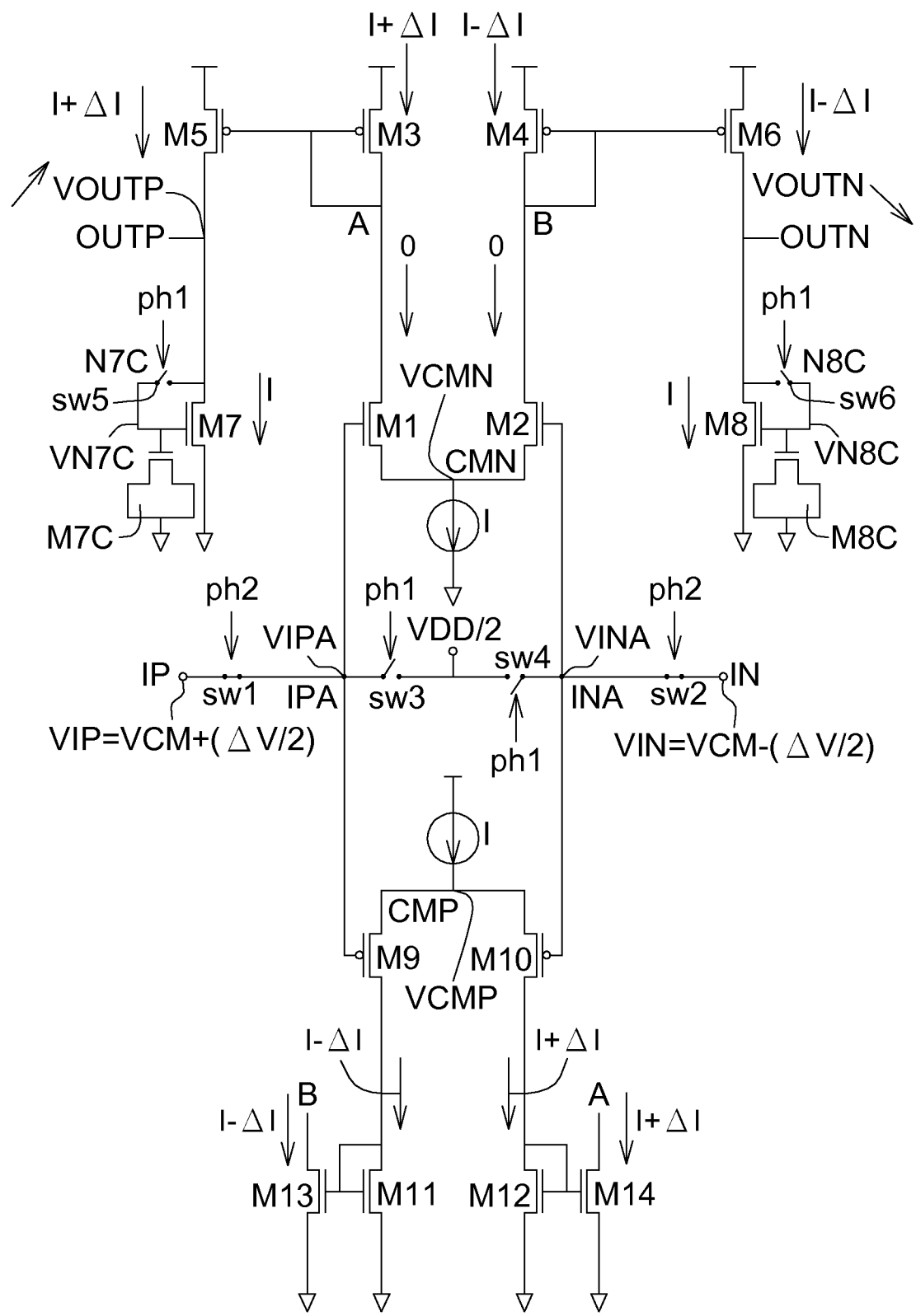
Figure 12B:
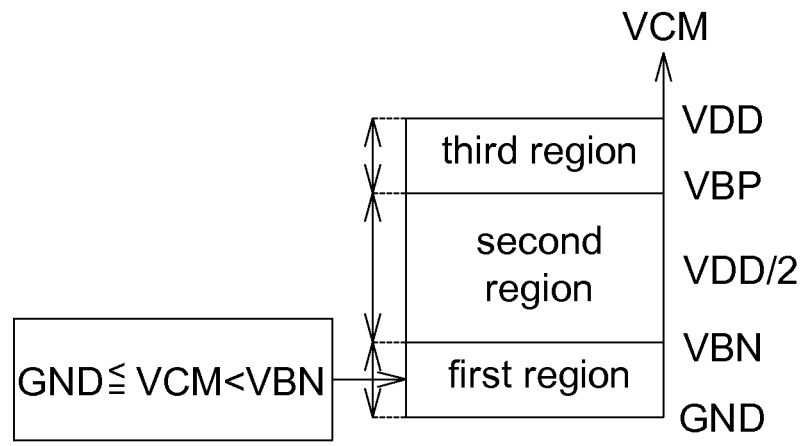
Figure 12B:
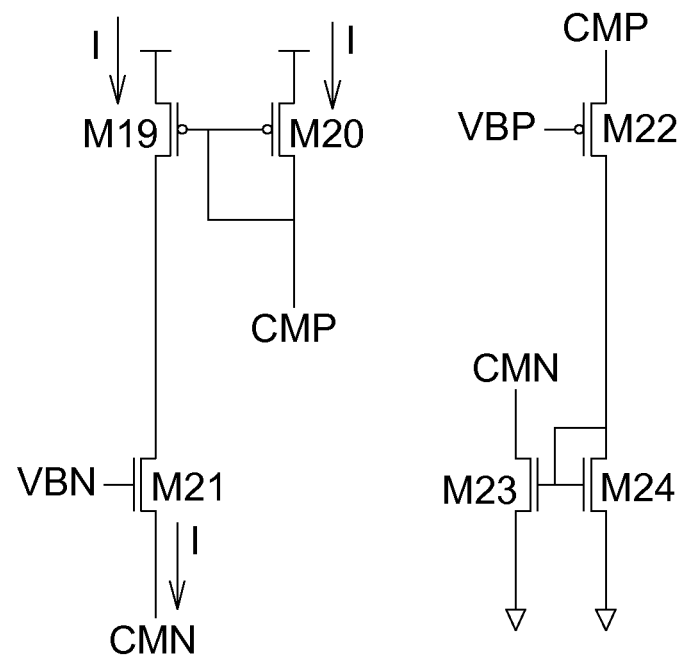

FIG. 12A and FIG. 12B are circuit operation diagrams of the comparator in the second step and GND≦VCM<VBN. If the voltage VIP of the differential input IP of the comparator is VCM+(ΔV/2), the voltage VIN of the differential input IN is VCM−(ΔV/2), and GND≦VCM<VBN, then the input common mode voltage of the OTA falls within the first region. The current switch M21 and the current mirror M19 and M20 are turned on, but the current switch M22 and the current mirror M23 and M24 are turned off. The NMOS transistor differential input pair M1 and M2 is turned off.

Since the transistor M20 and the current source both provide currents I to the node CMP, the current flowing through the node CMP is doubled (in comparison to the scenario when VBN<VCM<VBP). Thus, the currents flowing through the PMOS transistor differential input pair M10 and M9 is doubled as I+ΔI and I−ΔI from I/2+(ΔI/2) and I/2−(ΔI/2) respectively.

The current flowing to the transistor M11 is the same as the current flowing through the transistor M9, i.e. I−ΔI. The current flowing to the transistor M12 is the same as the current flowing through the transistor M10, i.e. I+ΔI. Due to current mirroring, the currents flowing to the transistors M13 and M14 are I−ΔI and I+ΔI respectively. Thus, the total currents flowing through the transistors M3 and M4 are I+ΔI and I−ΔI respectively. Due to current mirroring, the total currents flowing through the transistors M5 and M6 are I+ΔI and I−ΔI respectively. Since the gate voltages of the transistors M7 and M8 are stored in the NMOS capacitors M7C and M8C in the first step respectively, the currents flowing through the transistor M7 and M8 still remain at I.

The current flowing to the node OUTP from the transistor M5 is I+ΔI, but the current flowing to the transistor M7 from the node OUTP is I. The current difference ΔI flows to the decision circuit 200 via the node OUTP. Due to parasitic capacitance effect, the current difference ΔI causes the voltage VOUTP of the node OUTP to be raised. Similarly, the current flowing to the node OUTN from the transistor M6 is I−ΔI, but the current flowing to the transistor M8 from the node OUTN is I. The current difference ΔI is provided by the decision circuit 200. Due to parasitic capacitance effect, the current difference ΔI causes the voltage VOUTN of the node OUTN to be lowered. In this scenario, the operations of the decision circuit 200 are identical or similar to FIG. 8, and the details are not repeated here. Q(n)=1 indicates that the comparator detects and determines that the input voltage VIP is larger than the input voltage VIN. Q(n)=0 indicates that the comparator detects and determines that the input voltage VIP is smaller than the input voltage VIN.

To summarize, in the above embodiment of the present disclosure, if the input common mode voltage VCM tends to the ground voltage GND (for example, within the first region of FIG. 4), then the NMOS transistor differential input pair is turned off, but the current flowing to the PMOS transistor differential input pair is compensated. As indicated in FIG. 12A and FIG. 12B, the compensation current is provided by the current mirror M19 and M20. Likewise, if the input common mode voltage VCM tends to the operation voltage VDD (for example, within the third region of FIG. 4), the PMOS transistor differential input pair is turned off, but the current flowing to the NMOS transistor differential input pair is compensated. As indicated in FIG. 9A and FIG. 9B, the compensation current is provided by the current mirror M23 and M24 (in fact, the transistor M23 drains a current, and the NMOS transistor differential input pair provides higher currents). By compensating currents flowing to the differential input pair, the voltages VOUTP and VOUTN are quickly changed toward opposite directions (one is raised to the operation voltage VDD, and the other is lowered to the ground voltage GND) and the comparison results is obtained promptly. So that the range of the input common mode voltage identified by the comparator circuit according to the embodiment of the disclosure is rail-to-rail.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A comparator, comprising:
   a wide-swing operation transconductance amplifier (OTA), at least comprising a first and a second differential input pair for receiving a first and a second differential input signal respectively, the wide-swing OTA generating a first and a second intermediate output voltage in comparing the first and the second differential input signal;
   a current switch group;
   a current mirror group, wherein when an input common mode voltage of the first and the second differential input signal tends to one of a first and a second reference voltage, one of the first and the second differential input pair is turned off, and the current switch group and the current mirror group compensate a current flowing through the other of the first and the second differential input pair; and
   a decision circuit coupled to the wide-swing OTA, for enlarging a voltage difference between the first and the second intermediate output voltage to output a voltage comparison output signal.

2. The comparator according to claim 1, further comprising:
   an input switch group coupled between the wide-swing OTA and the first and the second differential input signal, for selectively conducting the first and the second differential input signal to the wide-swing OTA.

3. The comparator according to claim 1, further comprising:
   a plurality of voltage maintain circuits coupled to the wide-swing OTA, for maintaining a plurality of internal gate bias voltages of the wide-swing OTA.

4. The comparator according to claim 1, wherein, when the comparator is operated in an equalization stage under control of a plurality of control pulse signals, the first and the second differential input pair are turned on, two currents flowing through the first and the second differential input pair are the same, the first and the second intermediate output voltage have the same level, and the decision circuit outputs a previous voltage comparison output signal.

5. The comparator according to claim 1, wherein,
   the current switch group comprises a first and a second current switch; and the current mirror group comprises a first and a second current mirror coupled to the first and the second current switch respectively.

6. The comparator according to claim 5, wherein,
the first and the second reference voltage comprise a ground voltage and an operation voltage;
when the common mode voltage ranges between a first bias voltage and a second bias voltage, the first current switch and the first current mirror are turned off, the second current switch and the second current mirror are turned off, the first and the second differential input pair are turned on, and a current difference flows between the wide-swing OTA and the decision circuit so that one of the first and the second intermediate output voltage is raised and the other is lowered, and the decision circuit forms a positive feedback loop to further enlarge the voltage difference between the first and the second intermediate output voltage so that one of the first and the second intermediate output voltage is raised to the operation voltage and the other is lowered to the ground voltage.

7. The comparator according to claim 6, wherein,
when the common mode voltage is higher than the second bias voltage and tends to the operation voltage, the first current switch and the first current mirror are turned off, the second current switch and the second current mirror are turned on, the first and the second differential input pair are turned on and off respectively, the second current switch and the second current mirror compensate a first differential current flowing through the first differential input pair, the current difference flowing between the wide-swing OTA and the decision circuit so that one of the first and the second intermediate output voltage is raised and the other is lowered, and the decision circuit forms a positive feedback loop to further enlarge the voltage difference between the first and the second intermediate output voltage so that one of the first and the second intermediate output voltage is raised to the operation voltage and the other is lowered to the ground voltage.

8. The comparator according to claim 7, wherein,
when the common mode voltage is the same as the second bias voltage, the first current switch and the first current mirror are turned off, the second current switch and the second current mirror are turned on, the first and the second differential input pair are turned on, the second current switch and the second current mirror compensate the first differential current flowing through the first differential input pair, the current difference flows between the wide-swing OTA and the decision circuit so that one of the first and the second intermediate output voltage is raised and the other is lowered, and the decision circuit forms a positive feedback loop to further enlarge the voltage difference the first and the second intermediate output voltage so that one of the first and the second intermediate output voltage is raised to the operation voltage and the other is lowered to the ground voltage.

9. The comparator according to claim 8, wherein,
when the common mode voltage is the same as the first bias voltage, the first current switch and the first current mirror are turned on, the second current switch and the second current mirror are turned off, the first and the second differential input pair are turned on, the first current switch and the first current mirror compensate a second differential current flowing through the second differential input pair, the current difference flows between the wide-swing OTA and the decision circuit so that one of the first and the second intermediate output voltage is raised and the other is lowered, and the decision circuit forms a positive feedback loop to further enlarge the voltage difference between the first and the second intermediate output voltage so that one of the first and the second intermediate output voltage is raised to the operation voltage and the other is lowered to the ground voltage.

10. The comparator according to claim 9, wherein,
when the common mode voltage is lower than the first bias voltage and tends to the ground voltage, the first current switch and the first current mirror are turned on, the second current switch and the second current mirror are turned off, the first and the second differential input pair are turned off and on respectively, the first current switch and the first current mirror compensate the second differential current flowing through the second differential input pair, the current difference flows between the wide-swing OTA and the decision circuit so that one of the first and the second intermediate output voltage is raised and the other is lowered, and the decision circuit forms a positive feedback loop to further enlarge the voltage difference the first and the second intermediate output voltage so that one of the first and the second intermediate output voltage is raised to the operation voltage and the other is lowered to the ground voltage.

* * * * *